(12) United States Patent
Shin

(10) Patent No.: US 12,062,717 B2
(45) Date of Patent: Aug. 13, 2024

(54) STRUCTURE AND METHOD FOR MANUFACTURING A TRENCH POWER MOSFET

(71) Applicant: SK keyfoundry Inc., Cheongju-si (KR)

(72) Inventor: Hyun Kwang Shin, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 368 days.

(21) Appl. No.: 17/518,887

(22) Filed: Nov. 4, 2021

(65) Prior Publication Data

US 2022/0302303 A1 Sep. 22, 2022

(30) Foreign Application Priority Data

Mar. 16, 2021 (KR) ........................ 10-2021-0034265

(51) Int. Cl.
| | | |
|---|---|---|
| H01L 29/78 | (2006.01) | |
| H01L 21/02 | (2006.01) | |
| H01L 21/28 | (2006.01) | |
| H01L 21/311 | (2006.01) | |
| H01L 21/765 | (2006.01) | |
| H01L 29/10 | (2006.01) | |
| H01L 29/40 | (2006.01) | |
| H01L 29/66 | (2006.01) | |

(52) U.S. Cl.
CPC .... H01L 29/7813 (2013.01); H01L 21/02244 (2013.01); H01L 21/28185 (2013.01); H01L 21/31111 (2013.01); H01L 21/765 (2013.01); H01L 29/1095 (2013.01); H01L 29/407 (2013.01); H01L 29/66734 (2013.01)

(58) Field of Classification Search
CPC ............... H01L 29/7813; H01L 29/407; H01L 29/66734; H01L 21/28185
See application file for complete search history.

(56) References Cited

U.S. PATENT DOCUMENTS 7,199,010 B2 4/2007 Hijzen et al.
7,859,047 B2 12/2010 Kraft et al.
(Continued)

FOREIGN PATENT DOCUMENTS

EP 3 608 967 B1 3/2022
KR 10-2007-0032627 A 3/2007
(Continued)

OTHER PUBLICATIONS

Korean Office Action issued on May 30, 2022, in counterpart Korean Patent Application No. 10-2021-0034265 (9 pages in Korean).

*Primary Examiner* — Nduka E Ojeh
(74) *Attorney, Agent, or Firm* — NSIP Law

(57) ABSTRACT

A trench power MOSFET includes a body region disposed on a semiconductor substrate, a trench passing through the body region, an top electrode and a bottom electrode spaced apart from each other in a vertical direction in the trench, an inter-electrode dielectric layer disposed between the top electrode and the bottom electrode, and a plurality of dielectric layers, disposed between a sidewall of the trench and the bottom electrode, comprising a first oxide layer disposed on the sidewall of the trench, an barrier layer disposed on the first oxide layer, and a second oxide layer disposed on the barrier layer. The barrier layer is formed of a material different from materials of the first and second oxide layers.

21 Claims, 20 Drawing Sheets

(56) References Cited

U.S. PATENT DOCUMENTS

| | | |
|---|---|---|
| 10,861,966 B2 | 12/2020 | Feil et al. |
| 2007/0187753 A1 | 8/2007 | Pattanayak et al. |
| 2009/0050959 A1* | 2/2009 | Madson .............. H01L 29/7813 |
| | | 257/E29.345 |
| 2012/0061754 A1 | 3/2012 | Hsieh |
| 2020/0052110 A1* | 2/2020 | Feil ................... H01L 21/28167 |

FOREIGN PATENT DOCUMENTS

| | | |
|---|---|---|
| KR | 10-2020-0017360 A | 2/2020 |
| WO | WO 2005/065385 A2 | 7/2005 |

\* cited by examiner

STRUCTURE AND METHOD FOR MANUFACTURING A TRENCH POWER MOSFET

CROSS-REFERENCE TO RELATED APPLICATIONS

This application claims the benefit under 35 U.S.C. 119(a) of Korean Patent Application No. 10-2021-0034265 filed on Mar. 16, 2021 with the Korean Intellectual Property Office, the entire disclosure of which is incorporated herein by reference for all purposes.

BACKGROUND

1. Field

The present disclosure relates to a trench power MOSFET, and more particularly, a trench power MOSFET and a method of manufacturing the same for improving switching speed by minimizing parasitic capacitance (Cp) between an top electrode and a bottom electrode in a trench gate trench power MOSFET.

2. Description of Related Art

To minimize a gate-drain capacitance (Cgd) component in a trench power MOSFET structure, a split-gate trench (SGT) MOSFET structure is used with an top electrode and a bottom electrode are separately formed. Here, the top electrode is used as a gate electrode, and the bottom electrode is used as a field plate.

A thick oxide layer is formed between the upper and the bottom electrodes to reduce the gate capacitance or parasitic capacitance. However, there is a problem with the alternative art that when forming a thick oxide layer, the area of the active region is reduced as the sidewall of the trench is also oxidized. As the active area is narrowed, the amount of current decreases accordingly. A method of reducing the gate capacitance or parasitic capacitance while maintaining the gap between the trench and the trench is required.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a trench power MOSFET includes a body region disposed on a semiconductor substrate, a trench passing through the body region, an top electrode and a bottom electrode spaced apart from each other in a vertical direction in the trench, an inter-electrode dielectric layer disposed between the top electrode and the bottom electrode, and a plurality of dielectric layers, disposed between a sidewall of the trench and the bottom electrode, comprising a first oxide layer disposed on the sidewall of the trench, an barrier layer disposed on the first oxide layer, and a second oxide layer disposed on the barrier layer. The barrier layer is formed of a material different from materials of the first and second oxide layers.

A thickness of the inter-electrode dielectric layer in the vertical direction may be formed to be thicker than a thickness of the barrier layer.

The barrier layer may be formed closer to the top electrode than the bottom electrode.

The barrier layer may be formed of a silicon nitride layer having an etching speed different from etching speeds of the first and second oxide layers.

The barrier layer may be formed under the top electrode outside of the body region.

The barrier layer has a U shape, and the bottom electrode is formed within the U shape.

The trench power MOSFET may further include a drift region disposed on the semiconductor substrate, a gate dielectric layer disposed between the body region and the top electrode, a P-type body contact region and a N-type source region disposed in the body region, a contact plug disposed in contact with the P-type body contact region, and a source metal connected to the contact plug.

In another general aspect, a method of manufacturing a trench power MOSFET includes forming a trench in a semiconductor substrate, forming a first oxide layer on a sidewall of the trench, forming an barrier layer on the first oxide layer, forming a second oxide layer on the barrier layer, forming a bottom electrode in the second oxide layer, forming an inter-electrode dielectric layer on the bottom electrode, etching the second oxide layer, the barrier layer, and the first oxide layer, sequentially, to expose the sidewall of the trench, forming a gate dielectric layer on the exposed trench sidewall, and forming an top electrode on the gate dielectric layer.

The barrier layer may be a silicon nitride layer.

The forming of the inter-electrode dielectric layer may include depositing and etching back poly-silicon for the bottom electrode, forming a thick poly-silicon oxide layer by oxidizing a surface of the poly-silicon, and etching a portion of the thick poly-silicon oxide layer.

In the forming of the inter-electrode dielectric layer, the barrier layer may block the trench sidewall from being oxidized.

The forming of the gate dielectric layer may include depositing a CVD oxide layer to cover the barrier layer, and heat-treating the CVD oxide layer.

The barrier layer may have a U shape and the bottom electrode may be formed within the U-shaped barrier layer.

A thickness of the inter-electrode dielectric layer in the vertical direction may be formed to be thicker than a thickness of the barrier layer.

The method may further include forming a body region on the substrate, forming a N-type source region in the body region, forming an interlayer dielectric layer on the upper part of the top electrode, forming a contact hole by etching the interlayer dielectric layer, forming a P-type body contact region using the contact hole, forming a contact plug in the contact hole, and forming a source metal connected to the contact plug.

The barrier layer may be formed under the top electrode and outside of the body region.

The gate dielectric layer and the inter-electrode dielectric layer formed on the sidewall of the trench may be formed in different operations.

In another general aspect, a trench power MOSFET include a trench disposed in a semiconductor substrate, a bottom electrode disposed in the trench, an top electrode disposed on the bottom electrode, an inter-electrode dielectric layer disposed between the top electrode and the bottom electrode, a first oxide layer disposed on a sidewall of the trench, an barrier layer disposed on the first oxide layer, and a second oxide layer disposed on the barrier layer. The barrier layer is formed of a material different from materials of the first and second oxide layers.

A thickness of the inter-electrode dielectric layer in a vertical direction may be thicker than a thickness of the barrier layer in the vertical direction.

A concave groove may be formed on a lower surface of the top electrode.

A contour of a lower surface of the top electrode may include incline and planar surfaces.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
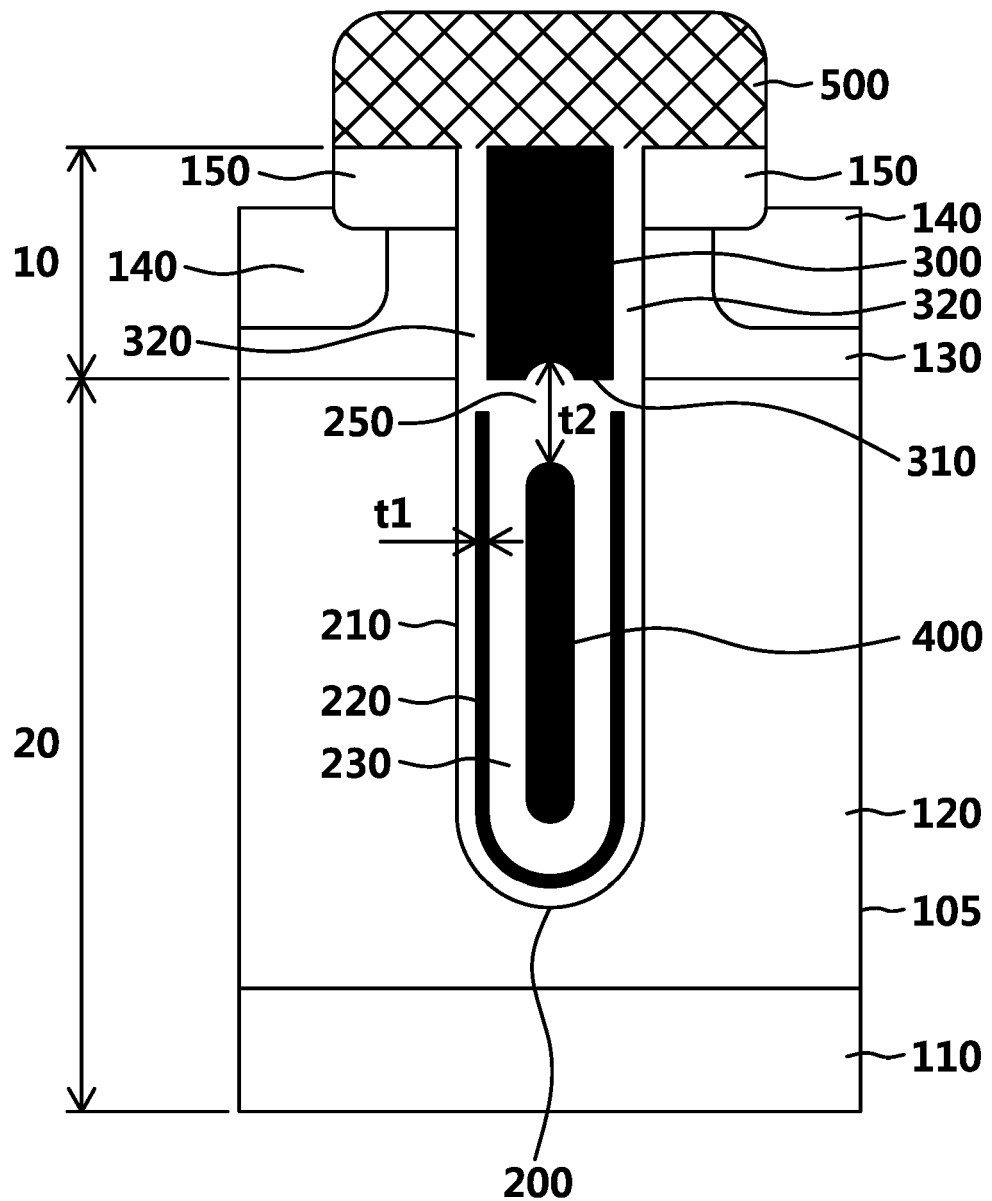
FIG. 1 is a cross-sectional view of a trench power MOSFET according to an example of the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The expression indicating a part such as "portion" or "part" used in the present disclosure means that it may represent a device in which a corresponding component may include a specific function, software that may include a specific function, or a combination of a device and software that may include a specific function, but not limited thereto. It is provided only to help a general understanding of the present disclosure and variety of modifications and variations from these substrates are possible by person having ordinary skill in the art.

In addition, it should be noted that all electrical signals used in the present disclosure are examples, and the signs of all electrical signals described below may be reversed when an inverter or the like is additionally provided in the circuit of the present disclosure. Thus, the scope of the present disclosure is not limited to the direction of the signal.

The present disclosure provides a trench power MOSFET and a method of manufacturing the same for reducing parasitic capacitance values and improving switching speed by forming a thick oxide layer between an top electrode and a bottom electrode.

The present disclosure also provides a trench power MOSFET and a manufacturing method for preventing trench sidewall from being oxidized when a thick oxide layer is formed between an top electrode and a bottom electrode.

FIG. 1 shows a cross-sectional view of a trench power MOSFET according to an example of the present disclosure. The drawing is illustrated with a focus on a trench region.

With reference to FIG. 1, a trench power MOSFET 100 may include a N-type semiconductor region 110 formed in a semiconductor substrate 105. Herein, the N-type semiconductor region 110 may play a role of a drain region 110. A N-type epi-layer 120 formed on the N-type semiconductor region 110. Herein, the N-type epi-layer 120 may be called a N-type drift region 120. A P-type body region 130 may be formed on the N-type drift region 120, and a P-type body contact region 140 and a N-type source region 150 may be formed in the P-type body region 130. The P-type body contact region 140 and the N-type source region 150 may be partially overlapped.

According to FIG. 1, a trench power MOSFET 100 may include a trench 200. A trench 200 may be formed to reach a N-type drift region 120 through a P-type body region 130. Although not shown, a plurality of trenches may be formed to be spaced, having a certain distance in a trench power MOSFET 100. A region between the pluralities of trenches may be called a mesa region or an active region. A trench 200 may be formed having a predetermined depth from a P-type body region 130 to a N-type epi-layer 120, and a bottom of a trench 200 may be spaced from a N-type semiconductor region 110.

An top electrode 300 and a bottom electrode 400 may be formed to be spaced apart from each other inside a trench 200. An top electrode 300 may be formed on a gate dielectric layer 320. An top electrode 300 has a width greater than that of the bottom electrode 400. An top electrode 300 and a bottom electrode 400 may be formed with a poly-silicon, and an top electrode 300 may be called a gate electrode. Also, a bottom electrode 400 may be called a source electrode, a field plate, or a shield plate. A bottom electrode 400 may be connected to a ground power or put in a floating state. Also, a bottom electrode 400 may be electrically connected to a source metal 600 (see FIG. 6) formed on a N-type source region 150. Therefore, a source metal 600 and a bottom electrode 400 may be connected with a certain voltage or used as a ground electrode.

An interlayer dielectric layer 500 may be formed to insulate a gate electrode 300 from a source metal 600. A contact plug 550 (see FIG. 6) may be formed by etching an interlayer dielectric layer, and a source metal 600 (see FIG. 6) electrically connected to a contact plug 550 may be formed. A tungsten metal may be used for a contact plug 550. Tungsten, aluminum, or copper metal may be used for a source metal 600.

As shown in FIG. 1, an inter-electrode dielectric layer 250 may be formed between an top electrode 300 and a bottom electrode 400. It may be a layer or film formed by oxidizing a poly-silicon used as a bottom electrode 400. Herein, an inter-electrode dielectric layer 250 may be called an inter-poly dielectric layer 250 because an top electrode and a bottom electrode are formed by a poly-silicon material. Or, it may be called an inter-electrode insulating layer 250.

According to FIG. 1, a concave groove may be formed in a bottom surface 310 of an top electrode 300, and a top surface of a bottom electrode 400 may be formed to have a round or circular shape. The shape of a top surface of a bottom electrode 400 may become different based on the method of forming the inter-electrode dielectric layer 250, which will be described in a section of a manufacturing method. In a manufacturing process, various shapes of a bottom electrode 400 may be achieved according to the shape of an inter-electrode dielectric layer 250. It is because a top surface of a bottom electrode 400 may be flat at first, but its edge may be more easily oxidized in an oxidation process.

As shown in FIG. 1, a trench may be divided into a first region 10 and a second region 20 based on a vertical direction. An top electrode 300 may be located in a first region, and a bottom electrode 400 may be placed in a second region 20.

For example, a plurality of dielectric layers 210, 220, 230 may be formed as an oxide layer—nitride layer—oxide layer (ONO). That is, a first oxide layer (thermal oxide layer) 210—an barrier layer 220—a second oxide layer 230, may be formed sequentially. Herein, a first oxide layer (thermal oxide layer) 210 and a second oxide layer 230 may be formed with the same material. However, an barrier layer 220 may be formed with a completely different material from a first oxide layer (thermal oxide layer) 210 and a second oxide layer 230. An etch selectivity between the barrier layer 220 and the first/second oxide layers 210 and 230 may also be different. An barrier layer 220 may be located under an top electrode 300, and it may not be disposed between an top electrode 300 and a body region 130. Also, an barrier layer 220 may have a 'U' shape. And, a bottom electrode 400 may be formed inside an barrier layer 220. Also, a height of an barrier layer 220 may be located higher than a height of a bottom electrode 400. Therefore, an barrier layer 220 may be formed closer to an top electrode 300, rather than a bottom electrode 400.

A first oxide layer 210 may be formed by oxidizing a sidewall of a trench at a high temperature, and it may be called a sidewall oxide layer. It is a dielectric layer located between a sidewall of a trench 200 and an barrier layer 220.

An barrier layer 220 may prevent the sidewall of the trench 200 from oxidation during a thermal oxidation process. When there is no barrier layer 220, the sidewall of the trench 200 may be easily oxidized, resulting in increasing a width of the trench. To prevent the issue, an barrier layer 220 is deposited on a first oxide layer 210. An barrier layer 220 may be an anti-thermal oxidant layer, an barrier dielectric layer, or an oxidation blocking layer. For example, a silicon nitride layer is used for the barrier layer 220.

A silicon nitride layer is used for an barrier layer 220 in the embodiment, but another dielectric layer may be selected with a different material that may block thermal oxidation. For example, SiON material may be selected. Also, an barrier layer 220 may not be formed in a first region 10 where a gate electrode 300 is formed. An barrier layer 220 needs a thickness of at least about 20-100 nm to prevent oxidation of a sidewall of a trench. When a thickness of an barrier layer 220 is below 20 nm, oxygen atoms may penetrate an barrier layer 220 into a sidewall of a trench, because a thickness of an barrier layer 220 is thin. A thickness of a first oxide layer 210, an barrier layer 220, and a second oxide layer 230 may be determined according to a specification of a trench power MOSFET, and it may be determined to be mostly a few dozen nm.

Likewise, according to the embodiment, in an oxidation process of a poly-silicon used as a bottom electrode, an barrier layer 220 may be formed inside a trench 200 composed of a silicon nitride layer to prevent oxidation of a sidewall of a trench. Thus, an inter-electrode dielectric layer 250 may be formed having a considerable thickness between an top electrode 300 and a bottom electrode 400.

A second oxide layer 230 may be deposited on an barrier layer 220 by an LPCVD method or a PECVD method. A width of a bottom electrode 400 may be adjusted by a thickness of a second oxide layer 230. The thicker a second oxide film 230 is, the narrower the width of a bottom electrode 400 becomes.

As shown in FIG. 1, a vertical thickness, t2 of an inter-electrode dielectric layer 250 may be formed thicker than a horizontal thickness, t1 of an barrier layer 220. For example, a vertical thickness of an inter-electrode dielectric layer 250 may be 100-300 nm, while a horizontal thickness of an barrier layer 220 may be 20-100 nm. An inter-electrode dielectric layer 250 may be formed by oxidizing a portion of a poly-silicon used as a bottom electrode 400. Or, an inter-electrode dielectric layer 250 may be formed by a CVD method, resulting in a CVD dielectric layer. The disclosure will further describe an oxide layer made by oxidizing a portion of a poly-silicon. Therefore, a gate dielectric layer 320 formed on a sidewall of a trench, and an inter-electrode dielectric layer 250 may be formed as an oxide layer with the same material. Still, they may be considered as a dielectric layer formed in a different operation.

An inter-electrode dielectric layer 250 may be used to space apart an top electrode 300 and a bottom electrode 400. Therefore, it may be possible to considerably reduce a parasitic capacitance between an top electrode 300 and a bottom electrode 400. If the vertical thickness of an inter-electrode dielectric layer 250 to be about 100-300 nm, a distance between an top electrode and a bottom electrode may be 100-300 nm. A distance between an top electrode and a bottom electrode is the same as the vertical thickness of an inter-electrode dielectric layer 250.

And, as shown in FIG. 1, a top of an top electrode 300 may be coplanar with a top of a N-type source region 150 in a horizontal direction, and a bottom of an top electrode 300 may be coplanar with a bottom of a P-type body region 130 in a horizontal direction.

Figure 2:
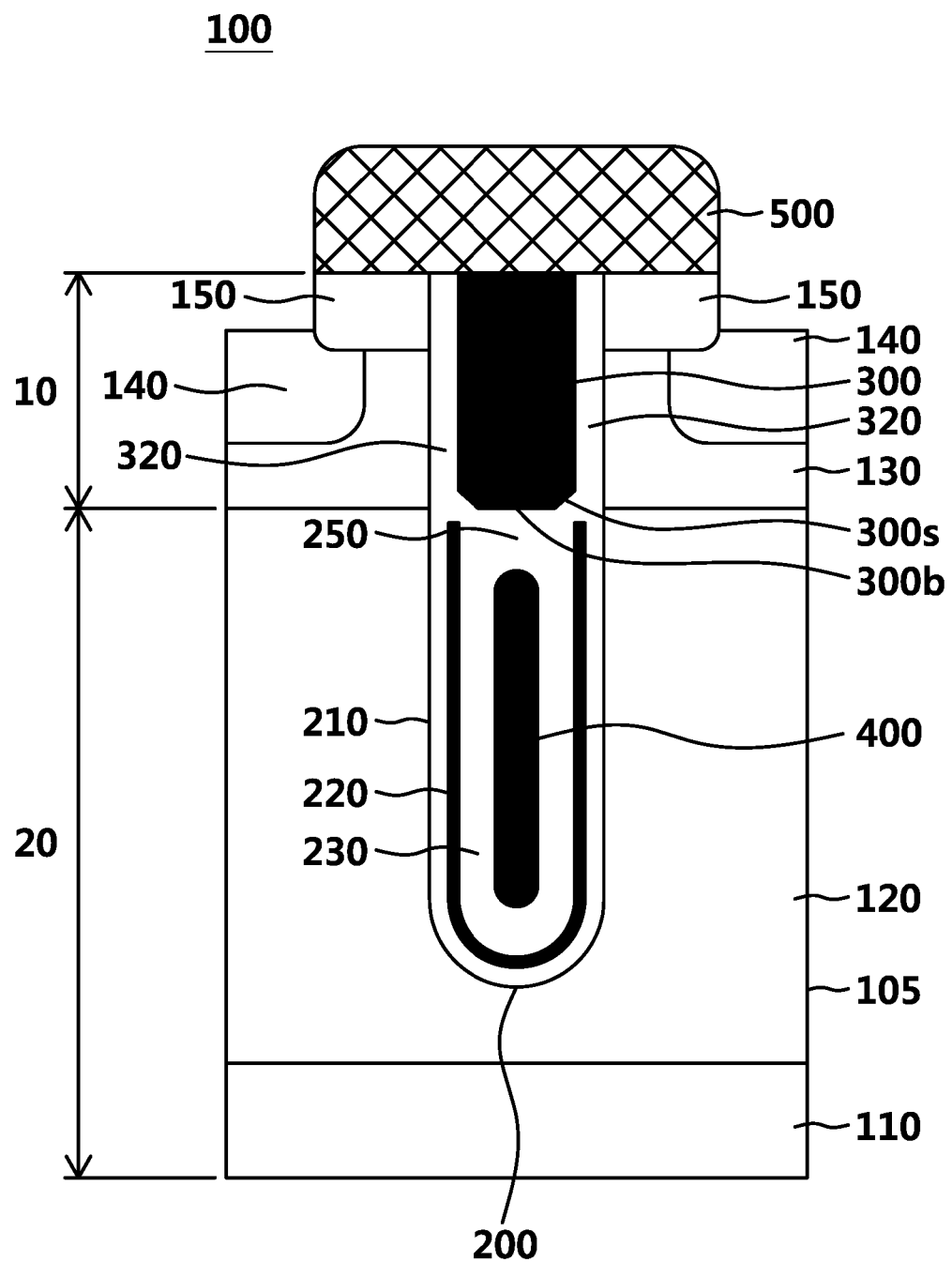
FIG. 2 is a cross-sectional view of a trench power MOSFET according to another example of the present disclosure.

FIG. 2 is a cross-sectional view of a trench power MOSFET according to another example of the present disclosure. The composition of FIG. 2 is identical to FIG. 1, except for the lower shape of an top electrode.

As illustrated in FIG. 2, the bottom surface 300b of the top electrode 300 is flat, and the side 300s is formed to be inclined. The trench power MOSFET 100 includes a high-concentration semiconductor region 110 and a low concentration epi-layer 120, a P-type body region 130 formed in the low concentration epi-layer 120, and a P-type body contact region 140 formed in the P-type body region 130 and a N-type source region 150. In addition, a trench 200 is formed from the P-type body region 130 to the low-concentration epi-layer 120 to a predetermined depth. The top electrode 300 and the bottom electrode 400 are spaced apart by an inter-electrode dielectric layer 250.

In addition, the top electrode 300 is positioned in the first region 10 of the trench 200, and the bottom electrode 400 is positioned in the second region 20. In addition, only the gate dielectric layer 320 is formed around the top electrode 300 in the first region 10. Three dielectric layers such as the first oxide layer 210—the barrier layer 220—the second oxide layer 230 are formed as a dielectric layer in the second region 20. The barrier layer 220 is not formed in the first region 10. The barrier layer 220 may be a silicon nitride layer, and the thicknesses of the first oxide layer 210, the barrier layer 220, and the second oxide layer 230 are decided to be the same or different depending on the specifications of the trench power MOSFET. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto. Next, two examples of the manufacturing process of the trench power MOSFET are described as follows.

FIG. 3 illustrates a manufacturing process of the trench power MOSFET as shown in FIG. 1.

Figure 3A:
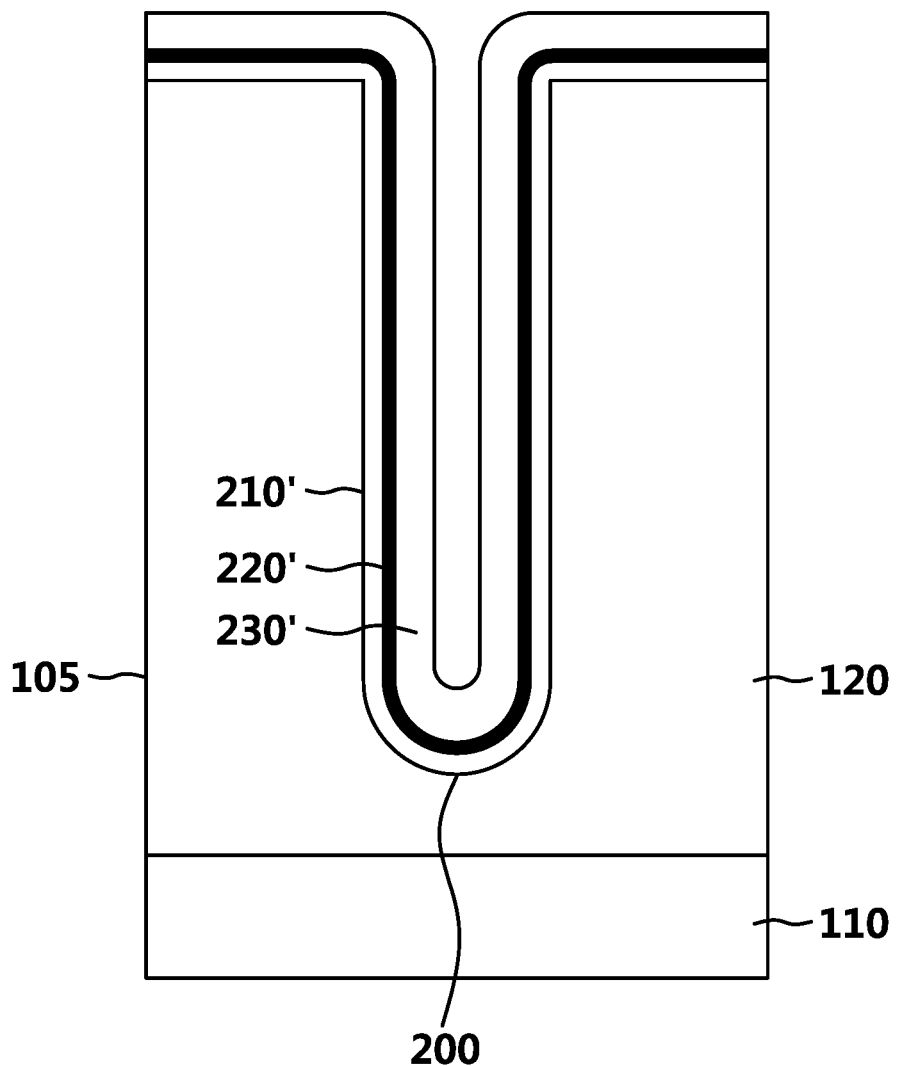
FIGS. 3A-3H are process diagrams sequentially illustrating a manufacturing process of the trench power MOSFET illustrated in FIG. 1.

FIG. 3A shows that an highly doped N-type semiconductor region 110 is prepared. Then, an epi-layer 120 is grown on the highly doped N-type semiconductor region 110. The trench 200 is formed in the epi-layer 120. Here, the highly doped N-type semiconductor region 110 serves as a drain region 110 of the trench power MOSFET 100.

A first thermal oxidation process is performed to form a first oxide layer 210' on a sidewall of the trench 200 by flowing oxygen (O2) gas at a high temperature of about 800° C. or higher with a thickness of about 10 to 200 nm. The first oxide layer 210' is a thermal oxide layer.

A first chemical vapor deposition (CVD) process is performed to form a silicon nitride layer 220' as an barrier layer on the first oxide layer 210'. The silicon nitride layer 220' has a thickness ranged from 20 to 300 nm.

A second chemical vapor deposition (CVD) process is performed to form a second oxide layer 230' on the silicon nitride layer 220' with a thickness of about 20 to 300 nm.

As a result of the processes, a first oxide layer 210', an barrier layer 220' and a second oxide layer 230' are sequentially formed on the sidewall of the trench 200.

Figure 3B:
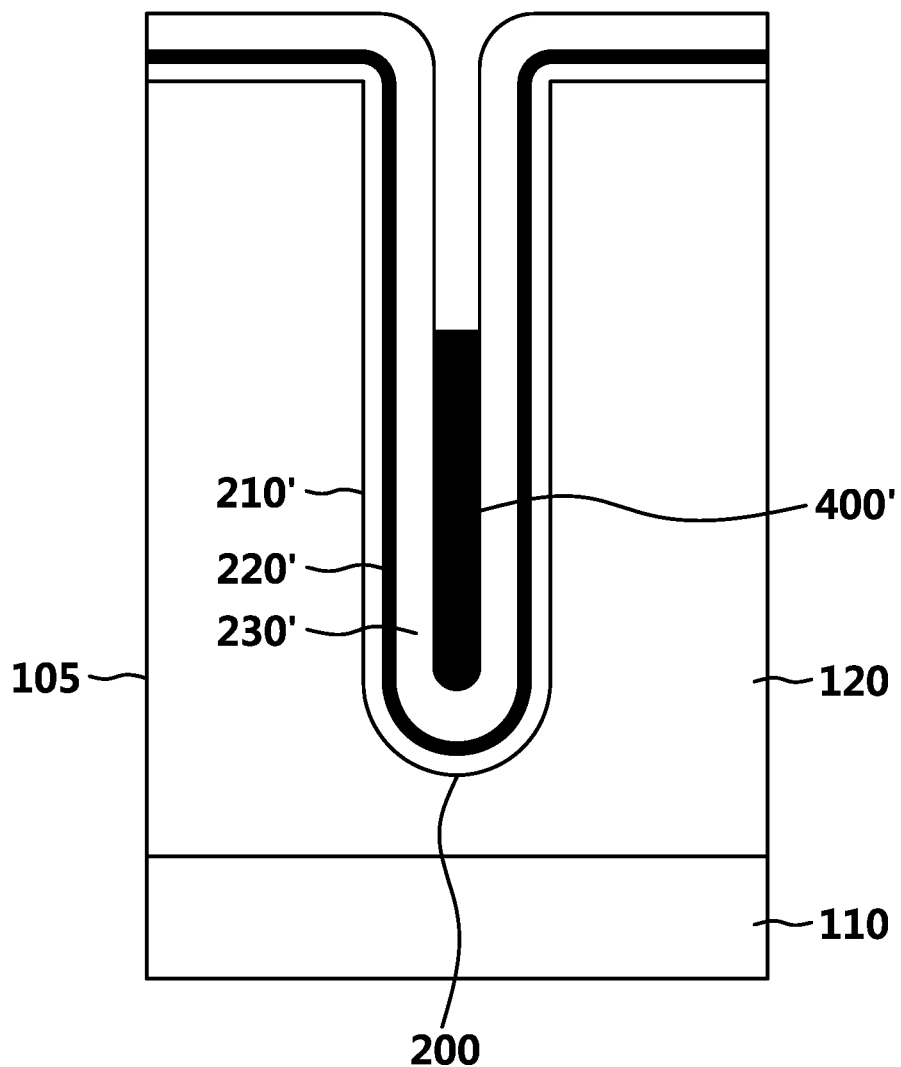

FIG. 3B illustrates that a conductive layer 400' is filled in the trench 200. The conductive layer 400' later becomes the bottom electrode. The conductive layer 400' may be formed from one of a poly-silicon material or a metal by using a LPCVD method. At first, the conductive layer 400' is fully deposited inside the trench 200. Then, the etching process is performed to reduce vertical thickness of the conductive layer 400' by using the CMP process or the etch back process. Finally, a bottom electrode 400' is formed in the trench 200. A top surface of the bottom electrode 400' is located higher than a position of ½ depth of the trench 200.

Figure 3C:
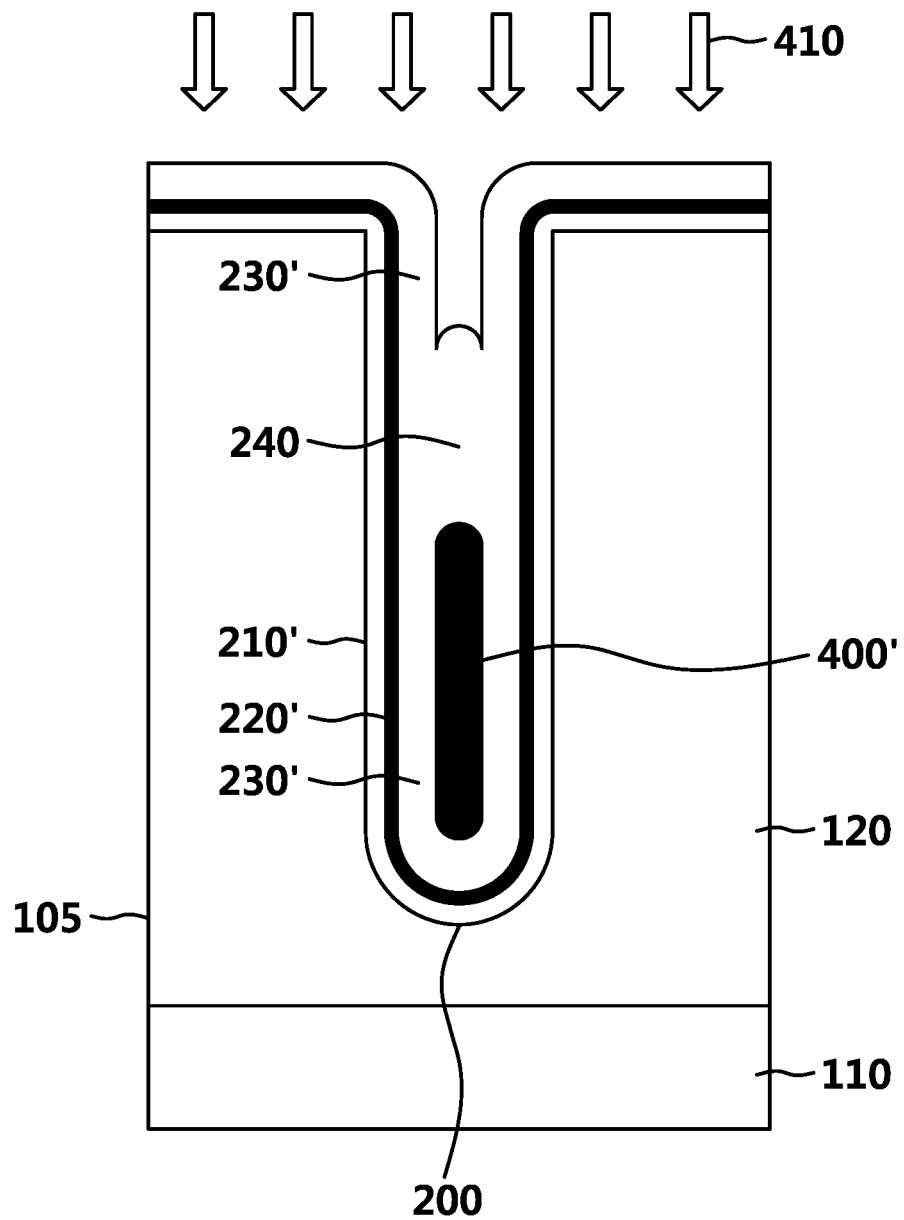

FIG. 3C illustrates a second thermal oxidation process to form a poly-Si oxide layer 240 on top of the bottom electrode 400'. The second thermal oxidation process is performed using oxygen (O2) gas at a high temperature of 800-1100° C. Due to the second thermal oxidation process, the conductive layer 400' may become smaller in size. All of the conductive layer 400' is not oxidized. An upper portion of the bottom electrode 400' is oxidized. A thick poly-Si oxide layer 240 is formed on the bottom electrode 400'. The thickness of the poly-Si oxide 240 depends on the second thermal oxidation time. As the second thermal oxidation time increases, the thickness of the poly-Si oxide layer 240 increases. If the poly-silicon oxide layer has to be thickened in order to reduce the parasitic capacitance, it is required that the second thermal oxidation time may be increased. The remaining bottom electrode 400' is used for a bottom electrode. An upper portion of the bottom electrode 400' has a round shape.

In the present example, the poly-Si oxide layer 240 may be grown for a sufficient time in the presence of the barrier layer 220'. The barrier layer 220' may prevent penetrating of oxygen gas into the sidewall of the trench 200 during the second thermal oxidation process. Thus, even if the second thermal oxidation process is performed for a sufficient time, the sidewall of the trench 200 is protected from the second thermal oxidation process due to the barrier layer 220'. If there is no barrier layer 220', oxygen gas is penetrated into the sidewall of the trench during the second thermal oxidation process, resulting in formation of unwanted thick oxide layer on the sidewall of the trench.

Furthermore, a first wet etching process 410 is performed to simultaneously remove the second oxide layer 230' and the poly-silicon oxide layer 240 using a buffered oxide etchant (BOE) or diluted HF (DHF) solution. A thickness of the poly-silicon oxide layer 240 is decreased after the first wet etching process. Instead of the wet etching process, a dry etching can be used. In this embodiment, the wet etching process is preferred rather than the dry etching.

Figure 3D:
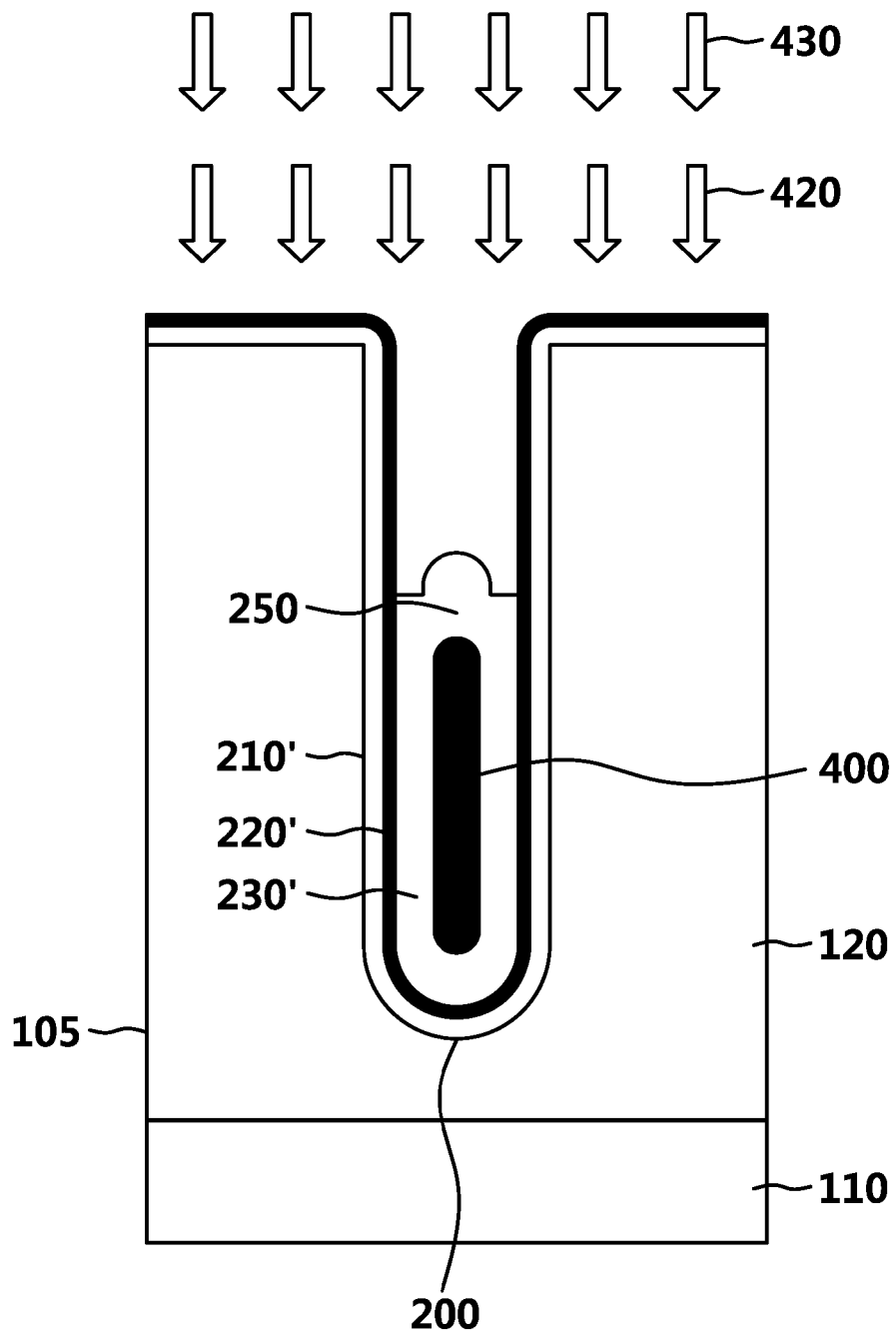

FIG. 3D illustrates that an upper portion of the barrier layer 220' is exposed after the first wet etching process 410 as described in FIG. 3C, and an inter-electrode dielectric layer 250 is formed on the bottom electrode 400. A top surface of the inter-electrode dielectric layer 250 has a convex shape.

As shown in FIG. 3D, a second wet etching process 420 is performed to remove the exposed barrier layer 220' by using a phosphoric acid solution. The second wet etching process uses a different chemical solution from that of the first wet etching process. As previously described, the barrier layer 220' is formed by a silicon nitride layer which is easily removed by the phosphoric acid solution.

After removing the exposed barrier layer 220', an upper portion of the first oxide layer 210' may be exposed. Then, a third wet etching process 430 is performed to remove the upper portion of the first oxide layer 210' by using a buffered oxide etchant (BOE) or diluted HF (DHF) solution. The third wet etching process 430 uses a different chemical solution from that of the second wet etching process 420.

Figure 3E:
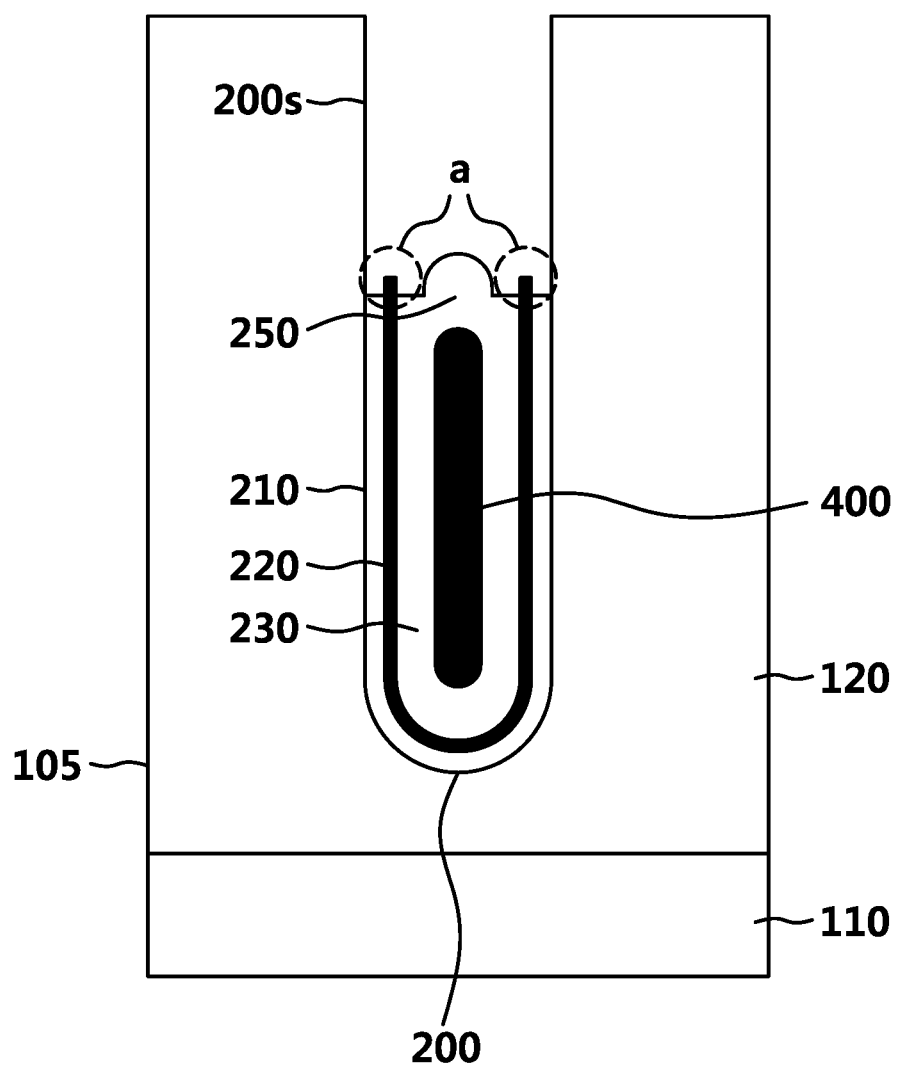

FIG. 3E illustrates that a portion of the sidewall 200s in the trench 200 may be exposed after the third wet etching process as described in FIG. 3D. A remaining barrier layer 220 has a U shape in the trench 200. The remaining barrier layer 220' is disposed in a lower portion of the trench 200. During the third wet etching process, the upper portion of the first oxide layer 210' is removed. Thus, an end part of the barrier layer 220' becomes a state of being protruded upward like 'a' area. After first-to-third wet etching processes, a first oxide layer 210, an barrier layer 220 and a second oxide layer 230 are formed in the lower portion of the trench 200, and being disposing between the epi-layer 120 and the bottom electrode 400.

Figure 3F:
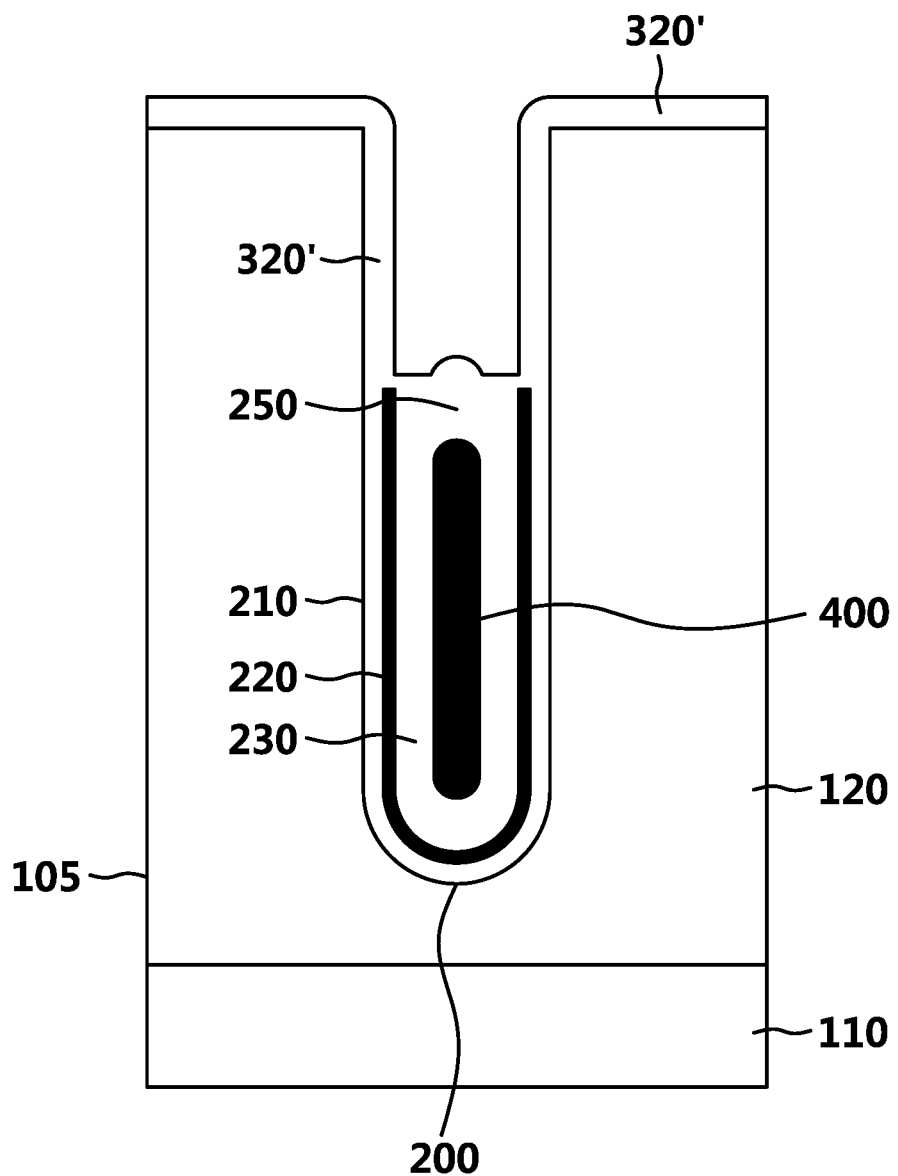

FIG. 3F shows that a gate dielectric layer 320' may be formed on the sidewall 200s of the trench 200 by thermal oxidation process at a high temperature of 800° C. or higher. Instead of thermal oxidation process, the gate dielectric layer 320' may be deposited by using a CVD method to cover the barrier layer 220. After deposition, annealing process may be further performed at a high temperature to have an high quality gate dielectric layer.

Figure 3G:
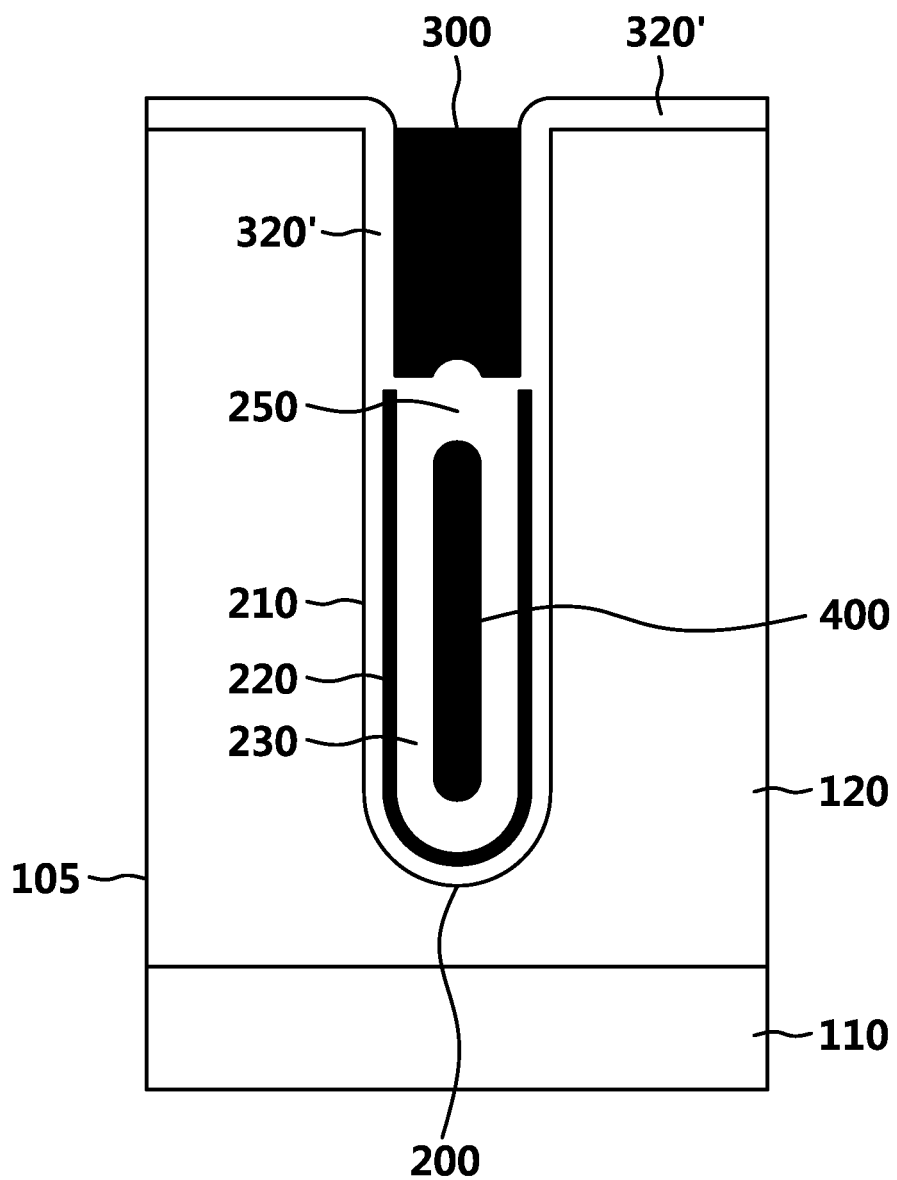

FIG. 3G illustrates that an top electrode 300 is formed on the gate dielectric layer 320' in an upper portion of the trench 200. The top electrode 300 may be formed by filling the trench 200 with a conductive layer, and then planarization process is performed to etch the conductive layer disposed on the top surface of the substrate 105 by using a chemical mechanical planarization (CMP) process. Alternatively, an etch back process is performed to etch the conductive layer disposed on the top surface of the substrate 105. That is, the top electrode 300 may be formed by applying an appropriate method in consideration of various factors such as the width of the trench 200 or device characteristics. In addition, the lower portion of the top electrode 300 is formed to be concave in correspondence with the shape of the inter-electrode dielectric layer 250 formed in the process of FIG. 3D.

Figure 3H:
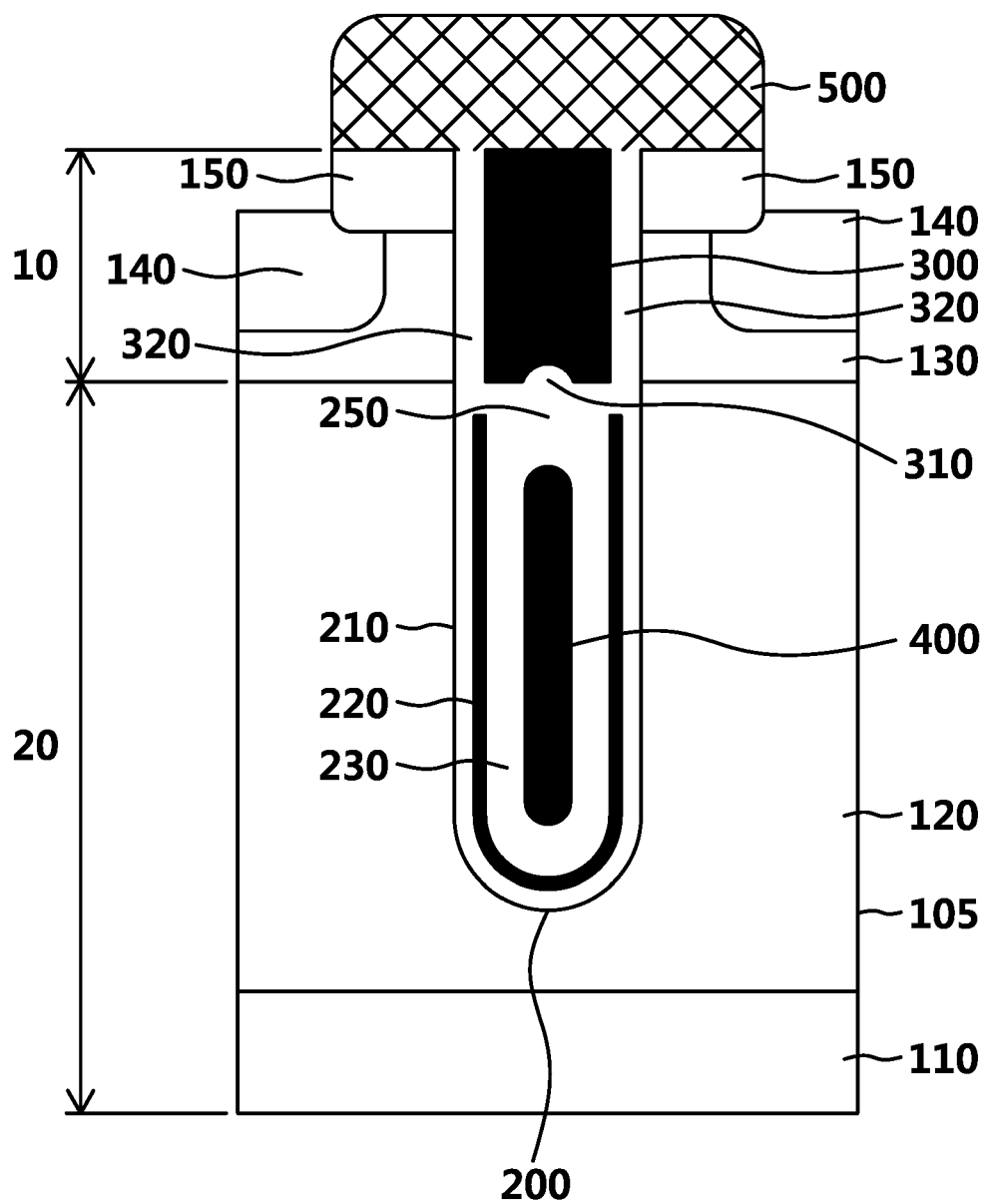

FIG. 3H illustrates that a P-type body region 130, high-concentration P-type body contact region 140, high-concentration N-type source region 150 are formed in the epi-layer 120.

A first ion implantation is performed to form a P-type body region 130 in the epi-layer 120 using P-type dopants. Then, a second ion implantation is performed to form an high-concentration N-type source region 150 on the P-type body region 130 using N-type dopants. An interlayer dielectric layer 500 is deposited to cover the P-type body region 130 and the N-type source region 150. Furthermore, the interlayer dielectric layer 500 is etched to form a contact hole (not shown), and the P-type body region 130 is partially exposed. A third ion implantation is performed to form a high-concentration P-type body contact region 140 in the P-type body region 130 using P-type dopants.

In the trench power MOSFET of the present disclosure manufactured through such a process, an inter-electrode dielectric layer 250 having a considerable thickness may be formed between the top electrode 300 and the bottom electrode 400, thereby effectively eliminating the problems caused in the split poly-Si structure of the alternative art.

FIG. 4 is a process diagram sequentially illustrating the trench power MOSFET manufacturing process illustrated in FIG. 2. The manufacturing process of FIG. 4 is similar to the manufacturing process of FIG. 3 and the description is focused on different parts. The different configuration is to become a part related to the lower shape of the top electrode.

Figure 4A:
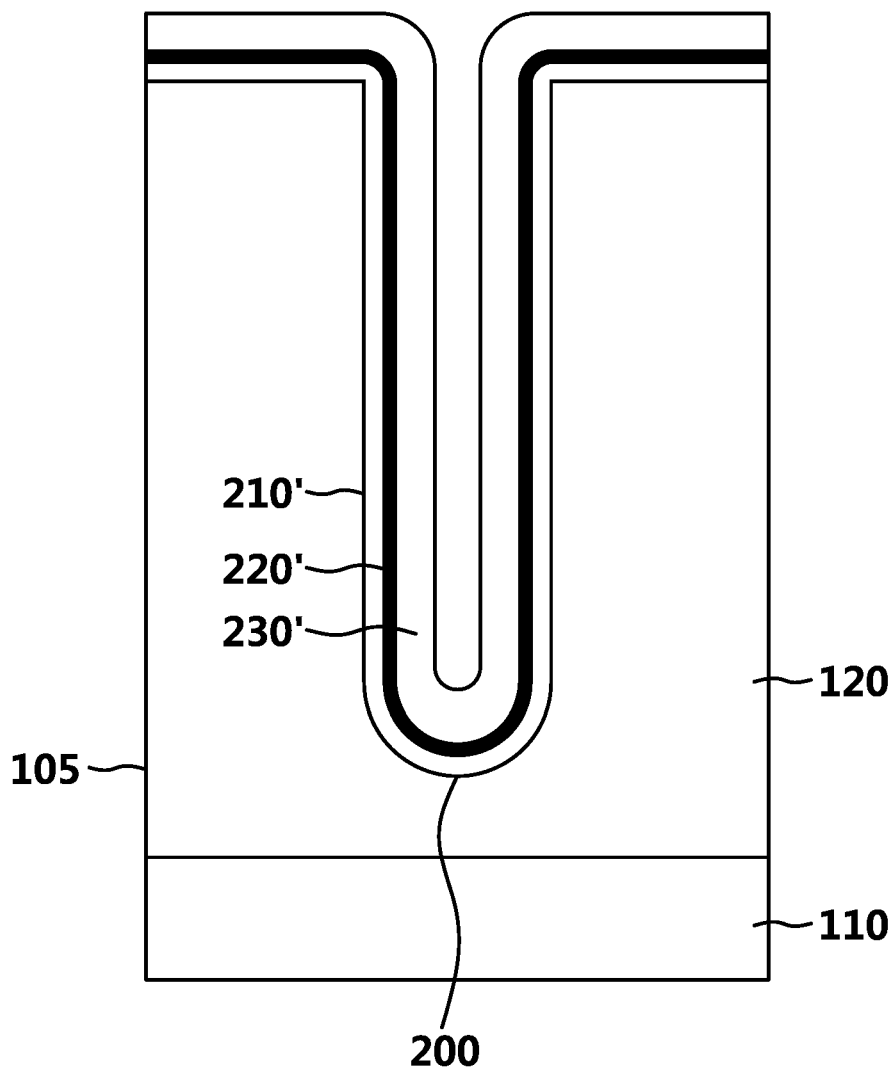
FIGS. 4A-4H are process diagrams sequentially illustrating a manufacturing process of the trench power MOSFET illustrated in FIG. 2.

In FIG. 4A, the epi-layer 120 is formed on the N-type semiconductor region (drain region, 110) formed on the semiconductor substrate 105. In addition, a trench 200 is formed in the etch layer 120, and a first oxide layer 210'—an barrier layer 220'—a second oxide layer 230' are formed in order in the trench 200.

Figure 4B:
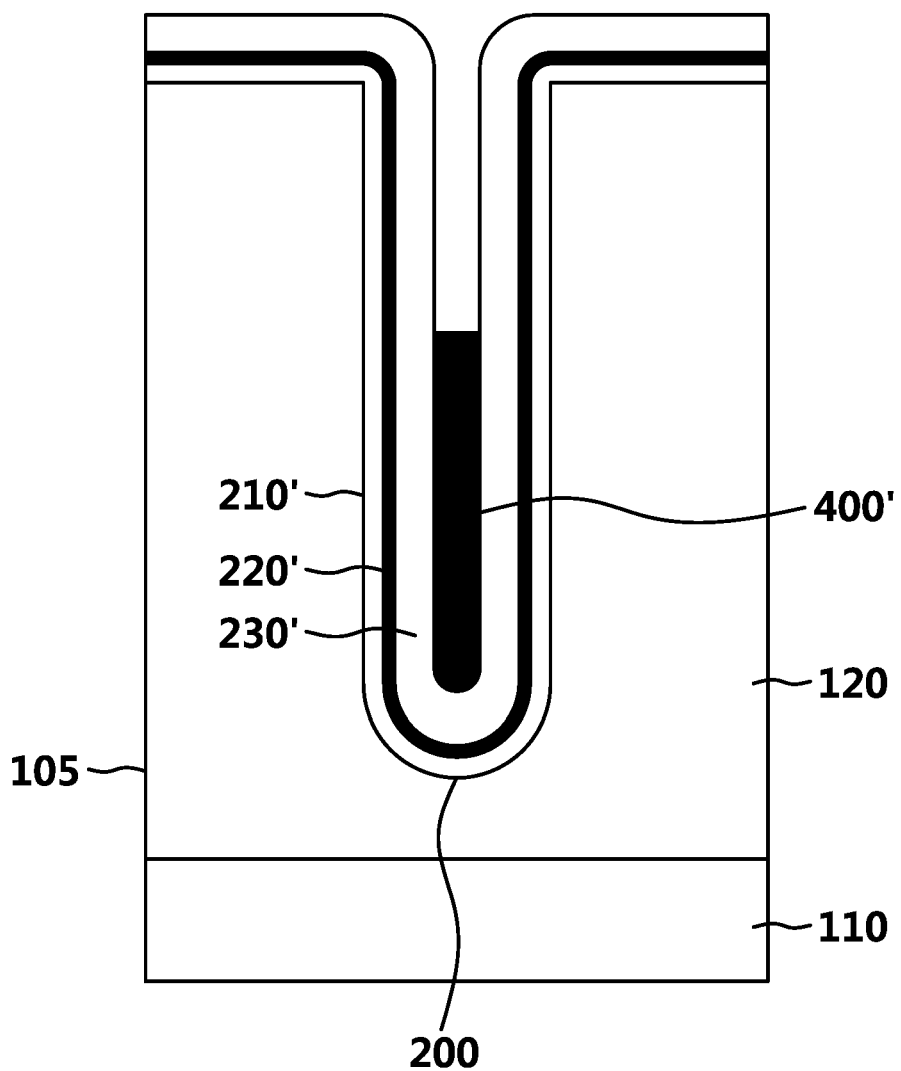

As illustrated in FIG. 4B, a conductive layer 400' is formed in the trench 200 by using a LPCVD method, wherein a poly-Si layer is used for the conductive layer 400'.

Figure 4C:
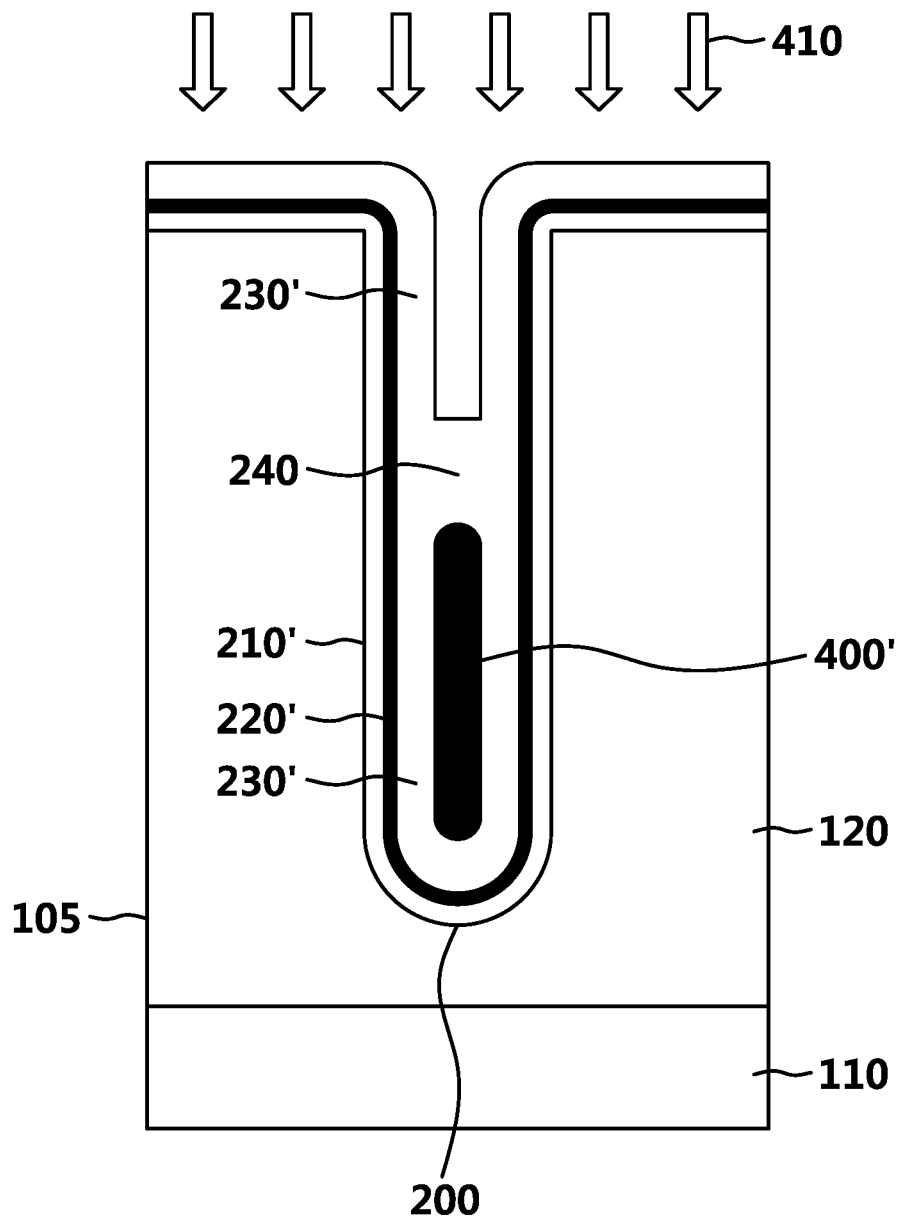

As illustrated in FIG. 4C, a thermal oxidation process is performed to form a poly-silicon oxide layer 240 by oxidizing a portion of the conductive layer 400'. The remaining non-oxidized conductive layer 400' becomes the bottom electrode 400. Even if the oxidation process is performed, an oxide layer is not additionally formed on the trench sidewall 200s due to the barrier layer 220'. A poly-silicon oxide layer 240 may be formed on the conductive layer 400' to a sufficient thickness. The upper portion of the bottom electrode 400 has a round or circular shape according to the oxidation process of the conductive layer 400'.

As illustrated in FIG. 4C, a first wet etching process 410 is performed to remove the second oxide layer 230'. In this process, the exposed second oxide layer 230' is all removed. In addition, the poly-silicon oxide layer 240 is also partially etched.

Figure 4D:
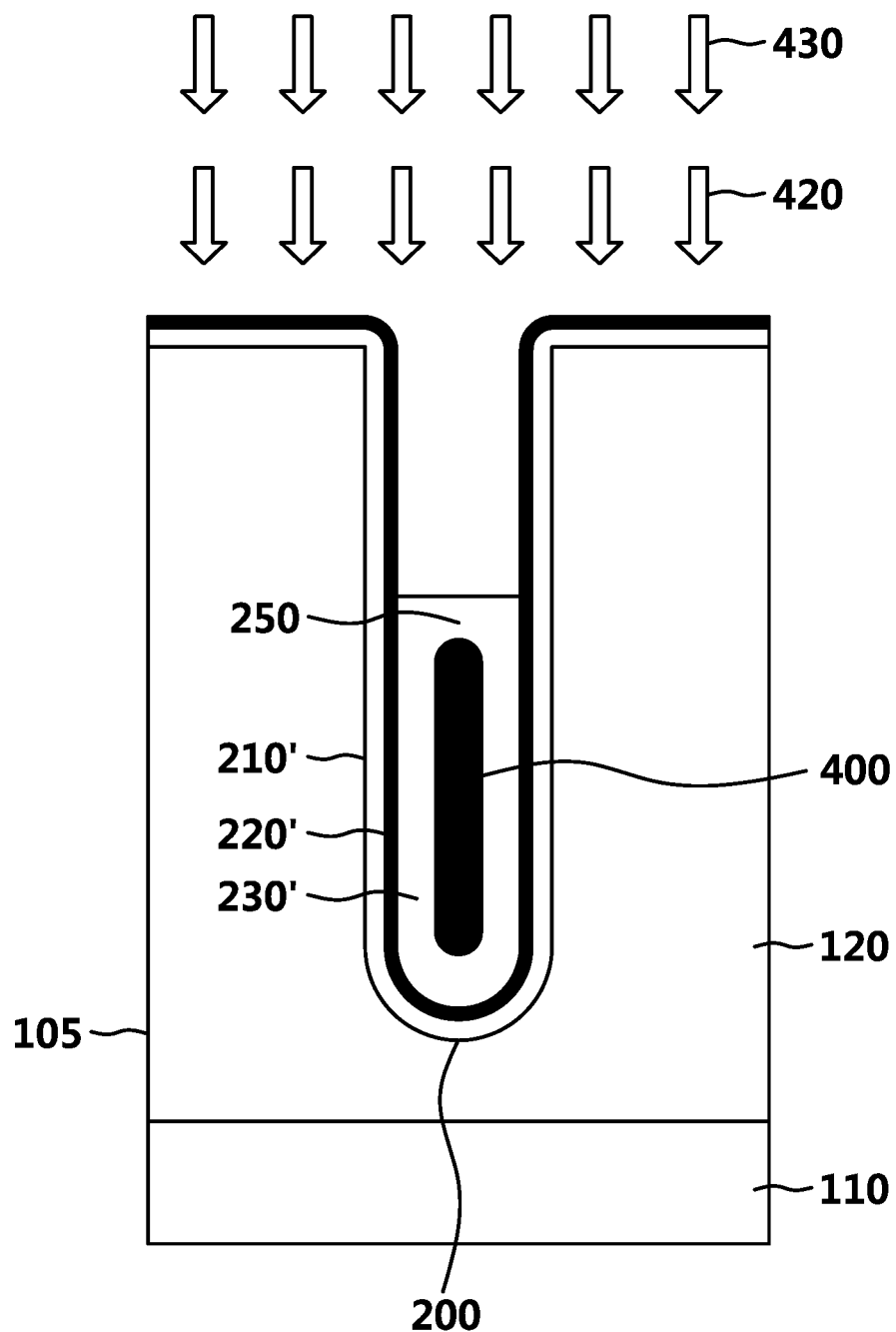

As illustrated in FIG. 4D, a second wet etching process 420 is performed to remove the exposed barrier layer 220'. Furthermore a third wet etching process 430 is performed to remove the first oxide layer 210' to expose the upper sidewalls of the trench 200. The third wet etching process 430 uses a different chemical solution from that of the second wet etching process 420.

Figure 4E:
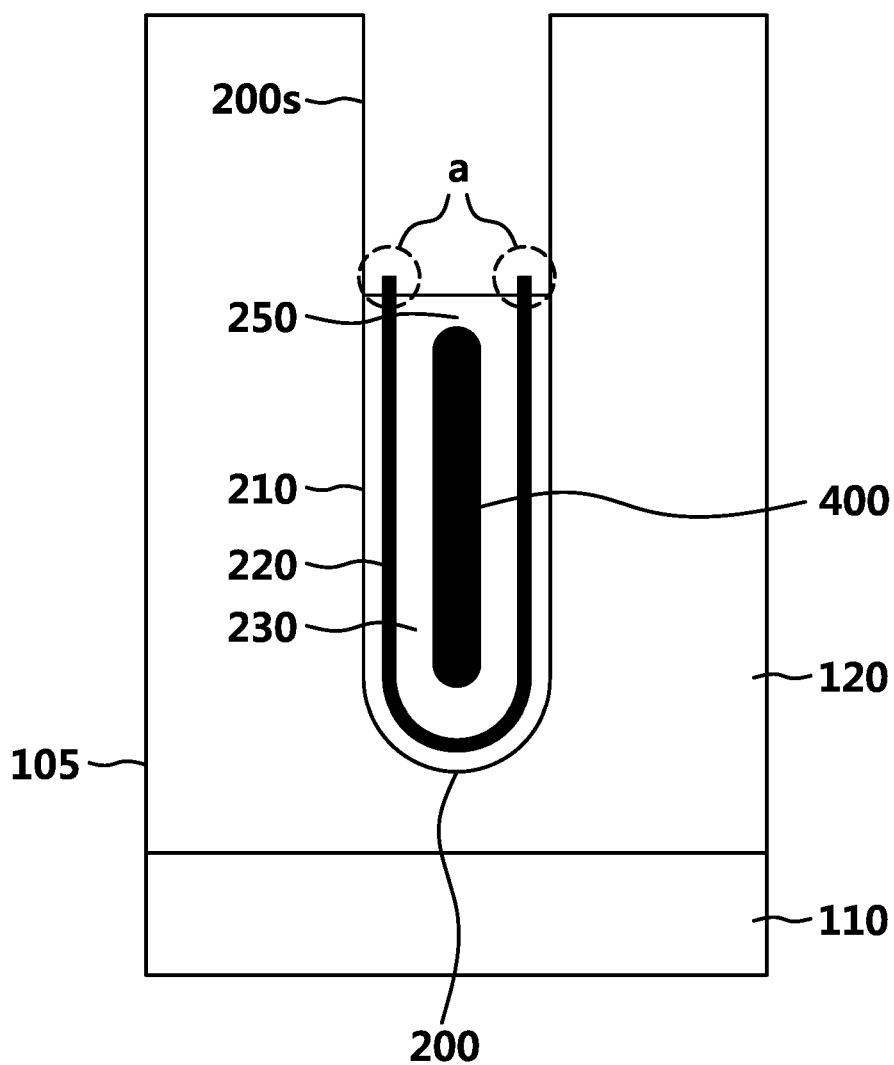

As illustrated in FIG. 4E, when the third wet etching process is completed, an inter-electrode dielectric layer 250 is formed on the bottom electrode 400. The surface of the inter-electrode dielectric layer 250 may be maintained to be flat. When the etching speed is high on both edges of the inter-electrode dielectric layer 250, a shape as illustrated in FIG. 3C may be obtained. In addition, the end of the barrier layer 220' is in a state of being protruded above the inter-electrode dielectric layer 250, like the area 'a'.

Figure 4F:
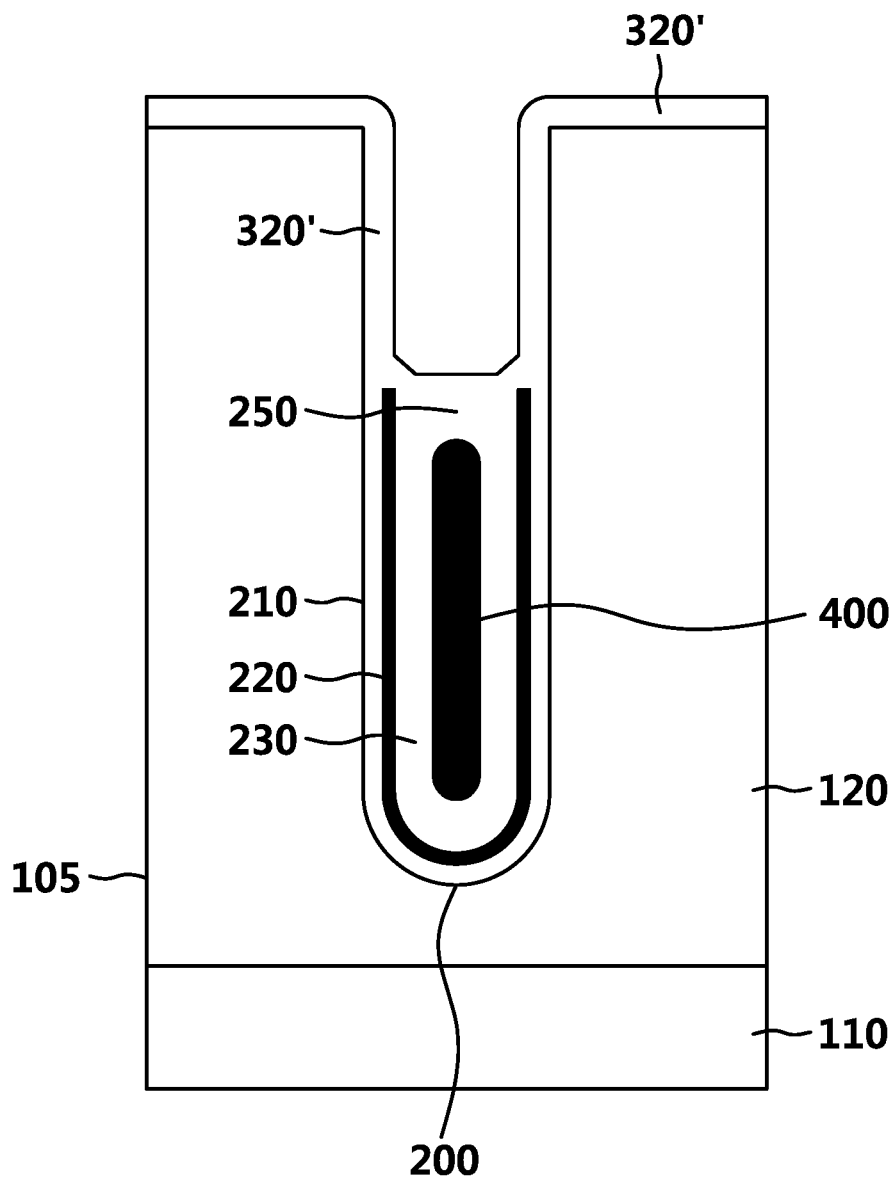

As illustrated in FIG. 4F, a gate dielectric layer 320' is formed on the sidewall of the trench 200 by using a CVD process, and the exposed end of the barrier layer 220 is covered by the gate dielectric layer 320'. Then, an annealing process at high temperature may be performed on the gate dielectric layer.

Figure 4G:
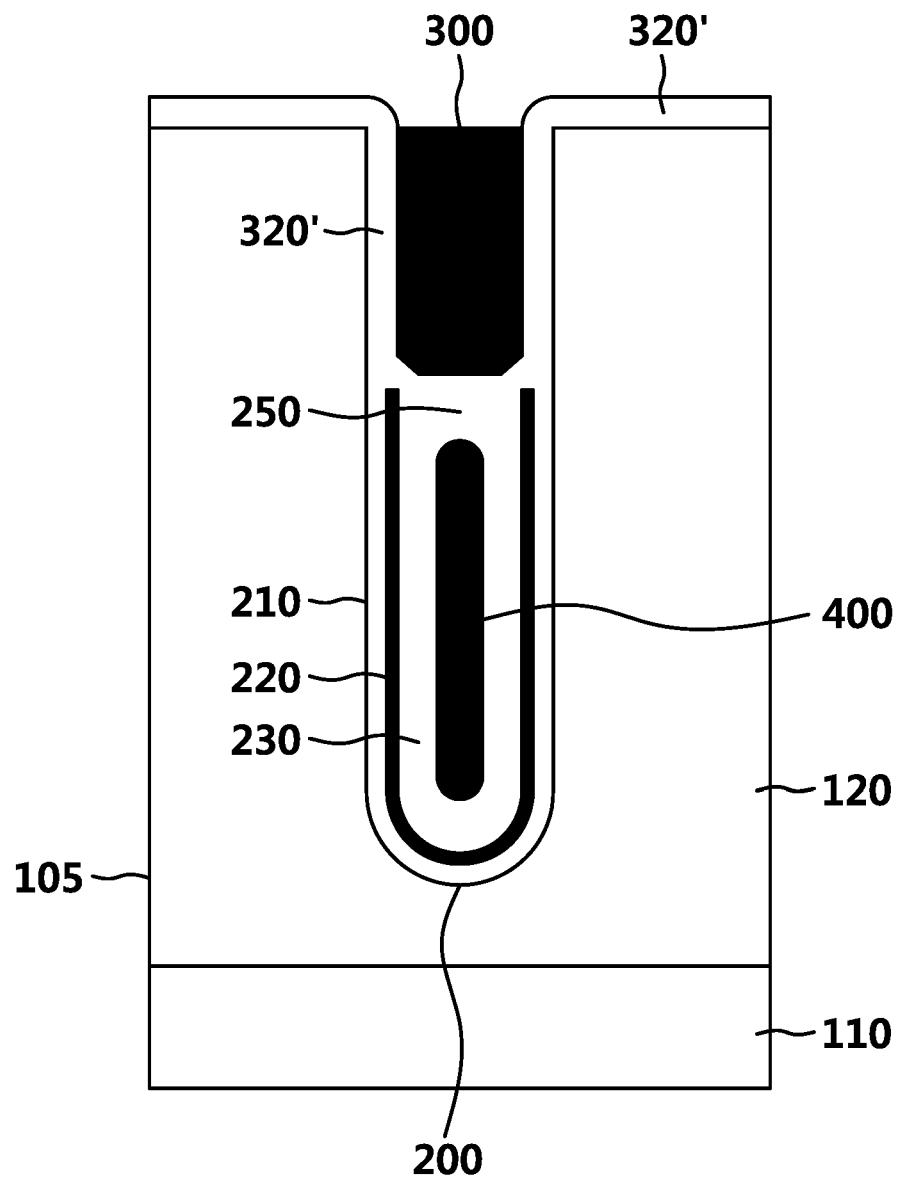

As illustrated in FIG. 4G, a conductive layer is filled in the trench 200 to form an top electrode or a gate electrode 300. A top surface of the top electrode 300 is formed in a flat shape. In addition, a bottom corner of the top electrode 300 is formed in an inclination.

Figure 4H:
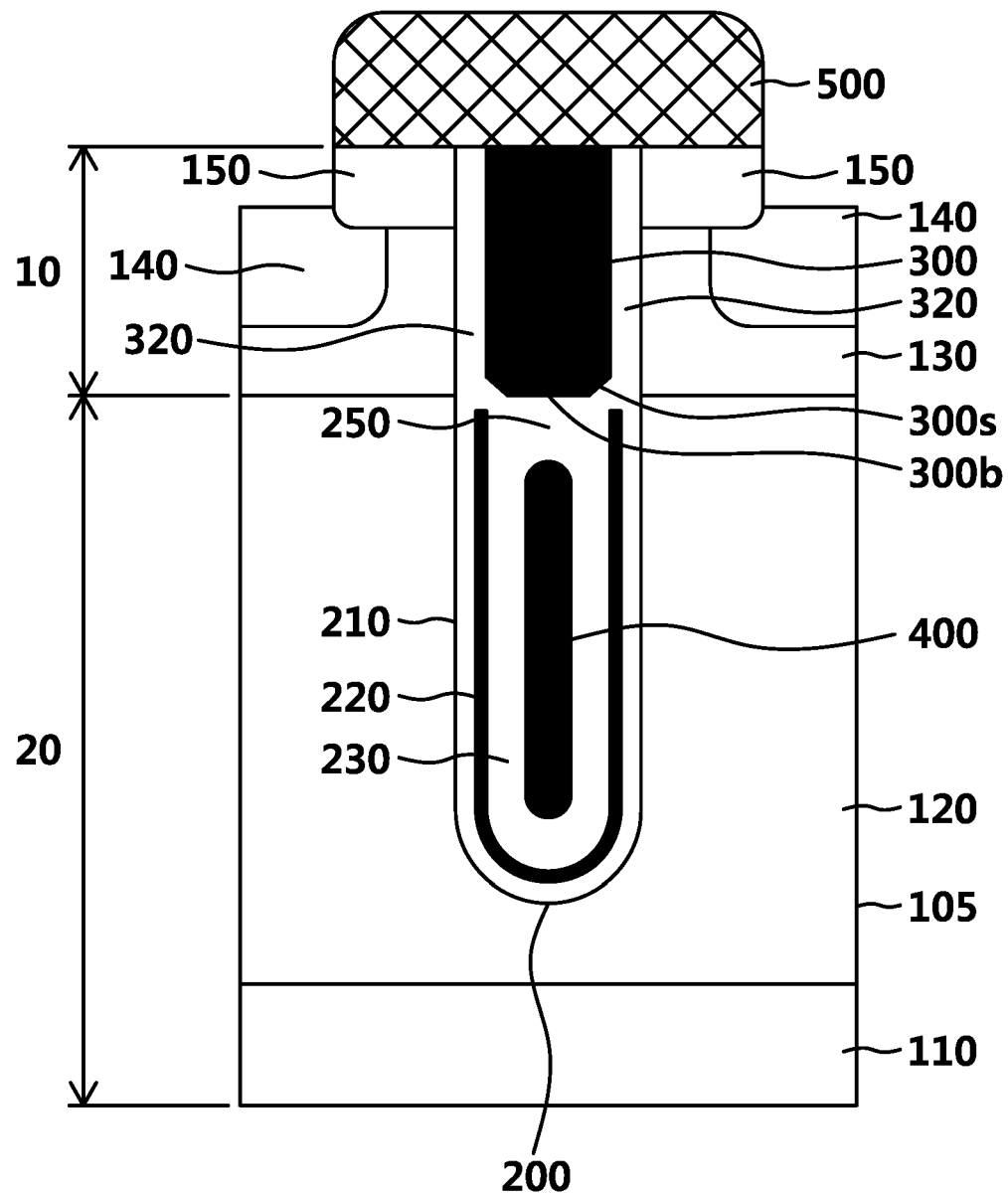

As illustrated in FIG. 4H, a P-type body region 130, a P-type body contact region 140 and a N-type source region 150 are formed in the substrate 105, and an interlayer dielectric layer 500 are formed on the P-type body region 130, the P-type body contact region 140 and the N-type source region 150.

Figure 5:
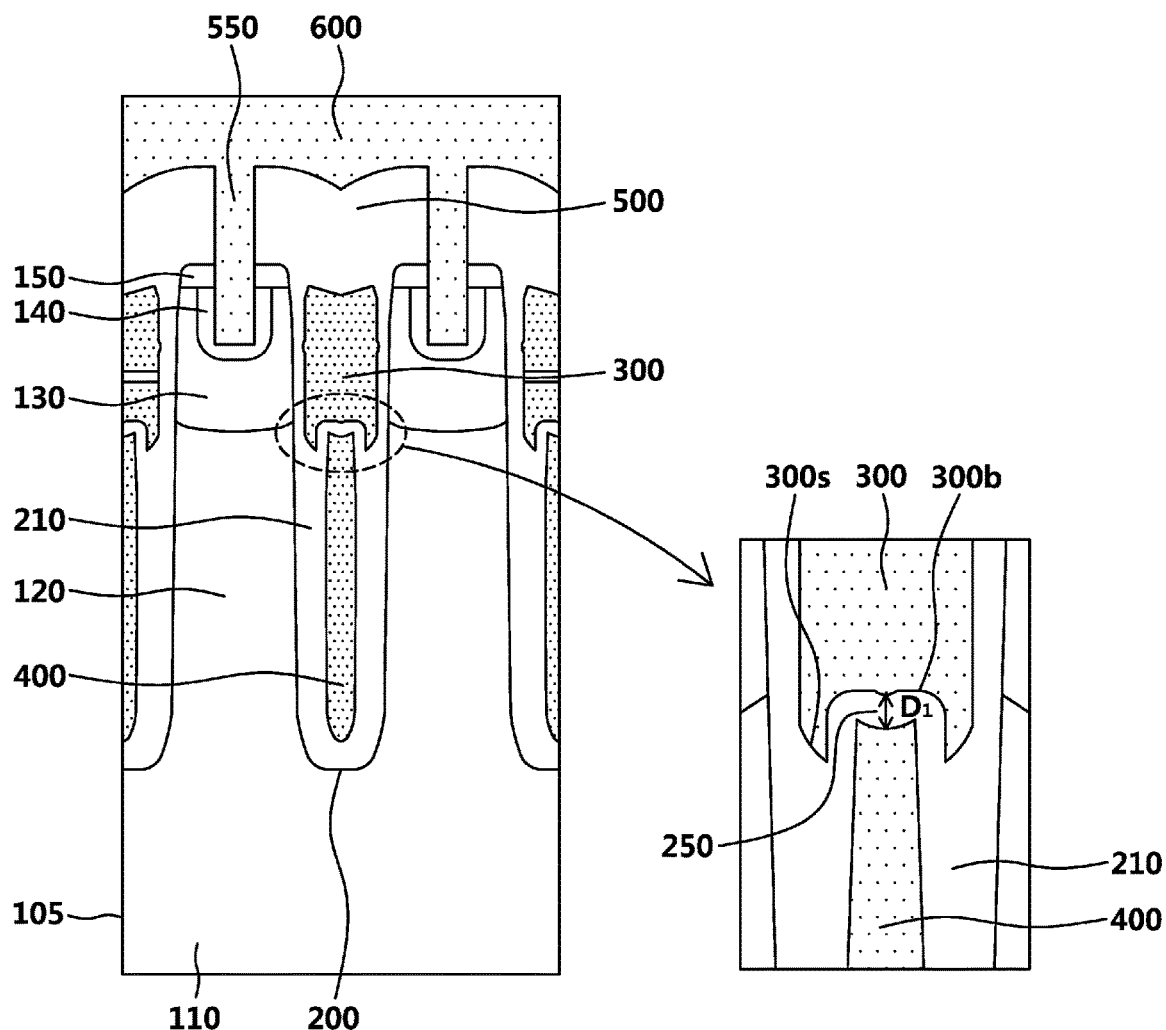
FIG. 5 illustrates a trench power MOSFET of alternative art.

FIG. 5 is a diagram illustrating a trench power MOSFET structure of the alternative art for comparison with the present disclosure. In FIG. 5, a thickness D1 between the top electrode 300 and the bottom electrode 400 is approximately 50 to 70 nm. That is, the thickness D1 of the inter-electrode dielectric layer 250 is about 50 to 70 nm. In addition, both sides of the top electrode have a shape that extends longer in the downward direction (for example, canine-shaped), and the upper part of the bottom electrode is formed to have a flat shape. As such, the lower portion of the top electrode is canine-shaped, and both sides have a shape surrounding the upper portion of the bottom electrode. The gap between the top electrode and the bottom electrode cannot be made larger due to the absence of the oxygen diffusion prevention layer 22. In addition, the electric field is concentrated to the region by the canine-shaped gate electrode 300 so that a large amount of leakage current may be generated.

Figure 6:
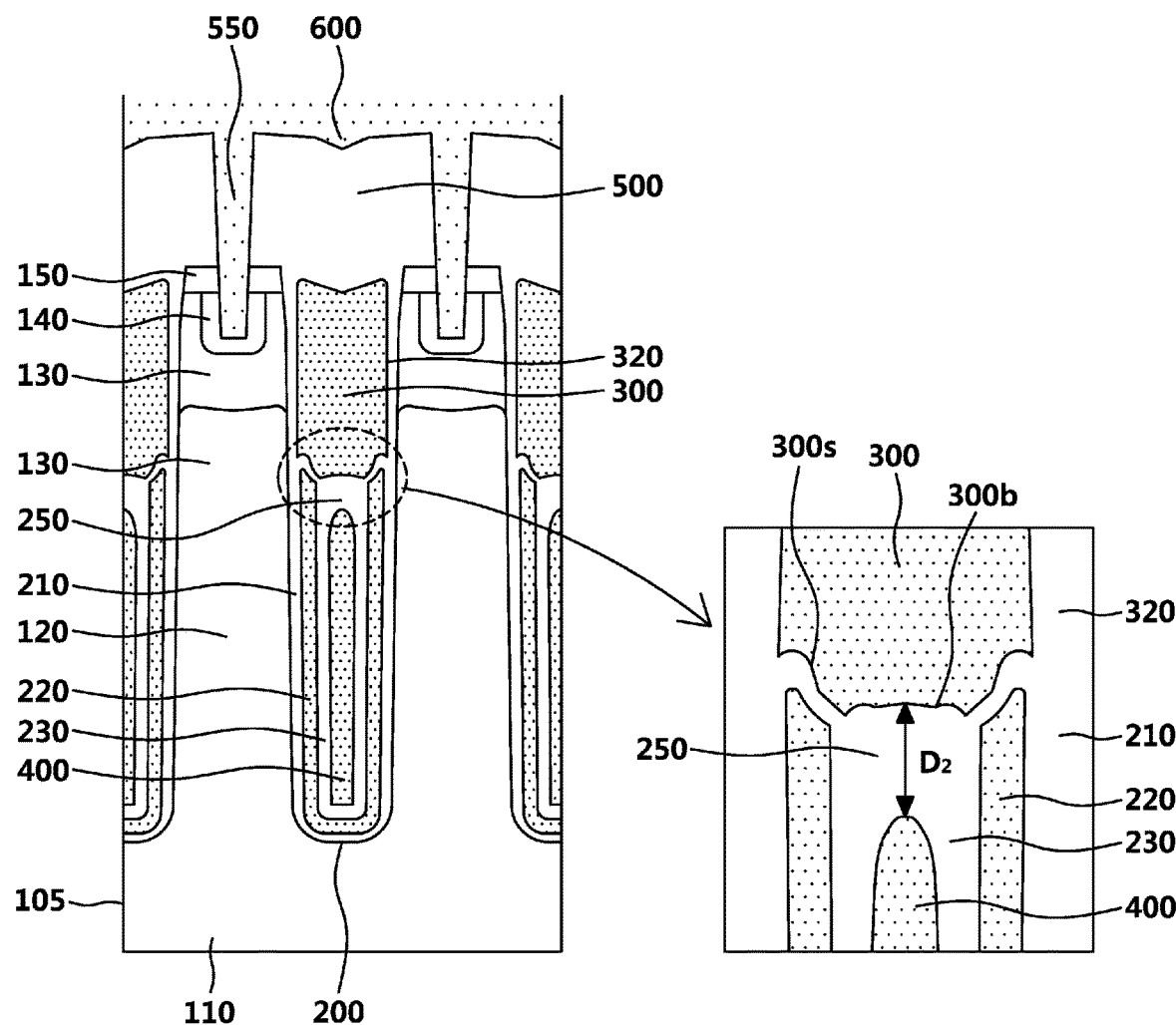
FIG. 6 illustrates a trench power MOSFET of the present disclosure.

FIG. 6 illustrates the trench power MOSFET of the present disclosure, and the bottom surface 300b of the top electrode 300 is generally flat. And the side 300s is formed in a gently curved shape with a slight inclination. Thus, less leakage current of the gate electrode 300 is generated. It may be formed in such a shape due to the presence of the barrier layer 220. The upper side of the barrier layer 220 is also formed to have a gentle inclination.

Here, the first oxide layer 210 and the second oxide layer 230 may be formed of the same material. However, the barrier layer 220 is formed of a material completely different from the first oxide layer 210 and the second oxide layer 230. Materials with different etching speeds are used. The barrier layer 220 is formed only under the top electrode 300 and is not formed between the top electrode 300 and the body region 130. In addition, the barrier layer 220 has a U shape. And the bottom electrode 400 is formed only in the U-shaped barrier layer 220. In addition, the height of the barrier layer 220 is positioned to be higher than the height of the bottom electrode 400. Thus, it is formed closer to the top electrode 300, and the barrier layer 220 is formed closer to the top electrode 300 than the bottom electrode 400.

In addition, the thickness D2 of the inter-electrode dielectric layer 250 positioned between the top electrode 300 and the bottom electrode 400 may be formed to be about 100-300 nm which is much thicker than the alternative art. Thus, the value of the parasitic capacitance between the gate and source may be reduced, and the switching speed may be improved.

As described above, because the thickness of the inter-electrode dielectric layer 250 between the top electrode 300 and the bottom electrode 400 in the present disclosure may be formed to be thicker than the alternative art by using the heat diffusion barrier layer 22, the parasitic capacitance existing between the top electrode and the bottom electrode may be reduced as much as possible, thereby improving the performance of the trench power MOSFET.

According to the trench power MOSFET and the method of manufacturing the same according to the present disclosure as described above, a thick oxide layer is formed between the top electrode and the bottom electrode, thereby reducing parasitic capacitance and improving the switching speed.

According to the present disclosure, the trench sidewall is protected by a thermal oxidation barrier layer. At the same time, the thick oxide layer is formed between the top electrode and the bottom electrode, thereby maintaining the originally designed trench width.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A trench power MOSFET comprising:
   a body region disposed on a semiconductor substrate;
   a trench passing through the body region;
   a top electrode and a bottom electrode spaced apart from each other in a vertical direction in the trench;
   an inter-electrode dielectric layer disposed between the top electrode and the bottom electrode; and
   a plurality of dielectric layers, disposed between a sidewall of the trench and the bottom electrode and comprising a first oxide layer disposed on the sidewall of the trench, a barrier layer disposed on the first oxide layer, and a second oxide layer disposed on the barrier layer,
   wherein the barrier layer is disposed spaced apart from the top electrode, and
   wherein the barrier layer is formed of a material different from materials of the first and second oxide layers.

2. The trench power MOSFET of claim 1, wherein a distance between the barrier layer and the top electrode is less than a distance between the bottom electrode and the top electrode.

3. The trench power MOSFET of claim 1, wherein the barrier layer is formed closer to the top electrode than the bottom electrode.

4. The trench power MOSFET of claim 1, wherein the barrier layer is formed of a silicon nitride layer having an etching speed different from etching speeds of the first and second oxide layers.

5. The trench power MOSFET of claim 1, wherein the barrier layer is disposed at some distance from the top electrode by the inter-electrode dielectric layer.

6. The trench power MOSFET of claim 1, wherein the barrier layer is U-shaped, and the bottom electrode is formed within the U-shaped barrier layer.

7. The trench power MOSFET of claim 1, further comprising:
   an N-type drift region disposed on the semiconductor substrate;
   the gate dielectric layer disposed between the body region and the top electrode;
   a P-type body contact region and an N-type source region disposed in the body region;
   a contact plug disposed in contact with the P-type body contact region; and
   a source metal connected to the contact plug.

8. A method of manufacturing a trench power MOSFET comprising:
   forming a trench in a semiconductor substrate;
   forming a first oxide layer on a sidewall of the trench;
   forming a barrier layer on the first oxide layer;
   forming a second oxide layer on the barrier layer;
   forming a bottom electrode in the second oxide layer;
   forming inter-electrode dielectric layer on the bottom electrode;
   sequentially etching the second oxide layer, the barrier layer, and the first oxide layer to expose the sidewall of the trench;
   forming a gate dielectric layer on the exposed trench sidewall; and
   forming a top electrode on the gate dielectric layer.

9. The method of claim 8, wherein the barrier layer is a silicon nitride layer and is disposed under the top electrode.

10. The method of claim 8, wherein the forming of the bottom electrode in the second oxide layer comprises:
    depositing a poly-silicon layer on the second oxide layer; and
    performing an etch-back process on the poly-silicon layer to form the bottom electrode.

11. The method of claim 10, wherein the forming of the inter-electrode dielectric layer comprises:
    performing an oxidation process on the etched poly-silicon layer to form a poly-silicon oxide layer disposed on the bottom electrode,
    wherein the poly-silicon oxide layer becomes the inter-electrode dielectric layer.

12. The method of claim 8, wherein the forming of the gate dielectric layer comprises:
    forming an oxide layer to cover the barrier layer; and
    performing an annealing process on the oxide layer to form the gate dielectric layer.

13. The method of claim 8, wherein the barrier layer is U-shaped and the bottom electrode is formed within the U-shaped barrier layer.

14. The method of claim 8, wherein a vertical thickness of the inter-electrode dielectric layer is formed to be thicker than a horizontal thickness of the barrier layer.

15. The method of claim 8, further comprising:
    forming a body region on the substrate;
    forming an N-type source region in the body region;
    forming an interlayer dielectric layer on the upper part of the top electrode;
    forming a contact hole by etching the interlayer dielectric layer;
    forming a P-type body contact region under the contact hole;
    forming a contact plug in the contact hole; and
    forming a source metal connected to the contact plug.

16. The method of claim 8, wherein the sequentially etching of the second oxide layer, the barrier layer, and the first oxide layer to expose the sidewall of the trench comprises:
    performing a first wet etching process to remove the second oxide layer;
    performing a second wet etching process to remove the barrier layer, wherein the second wet etching process uses a different chemical solution from that of the first wet etching process; and
    performing a third wet etching process to remove the first oxide layer disposed on the sidewall of the trench.

17. The method of claim 8, wherein the gate dielectric layer and the inter-electrode dielectric layer formed on the sidewall of the trench are formed by different processes.

18. A trench power MOSFET comprising:
    a trench disposed in a semiconductor substrate;
    a bottom electrode disposed in the trench;
    a top electrode disposed on the bottom electrode;
    an inter-electrode dielectric layer disposed between the top electrode and the bottom electrode;
    a first oxide layer disposed on a sidewall of the trench;
    a barrier layer disposed on the first oxide layer; and
    a second oxide layer disposed on the barrier layer,
    wherein the barrier layer is disposed spaced apart from the top electrode, and
    wherein the barrier layer is formed of a material different from materials of the first and second oxide layers.

19. The trench power MOSFET of claim 18, wherein a distance between the barrier layer and the top electrode is less than a distance between the bottom electrode and the top electrode.

20. The trench power MOSFET of claim 18, wherein a concave groove is formed on a lower surface of the top electrode.

21. The trench power MOSFET of claim 18, wherein the barrier layer and the top electrode are disposed facing each other and surfaces that face each other are sloped.

* * * * *